US012794483B2

(12) United States Patent
Kang et al.

(10) Patent No.: US 12,794,483 B2
(45) Date of Patent: Nov. 10, 2026

(54) SUCCESSIVE APPROXIMATION REGISTER ANALOG-TO-DIGITAL CONVERTER AND ERROR CORRECTION METHOD THEREFOR

(71) Applicant: Chengdu Sino Microelectronics Technology Co., Ltd., Chengdu (CN)

(72) Inventors: Pintang Kang, Chengdu (CN); Yuhang He, Chengdu (CN); Lei Chen, Chengdu (CN); Xing Zhu, Chengdu (CN)

(73) Assignee: Chengdu Sino Microelectronics Technology Co., Ltd., Chengdu (CN)

( * ) Notice: Subject to any disclaimer, the term of this patent is extended or adjusted under 35 U.S.C. 154(b) by 146 days.

(21) Appl. No.: 19/026,791

(22) Filed: Jan. 17, 2025

(65) Prior Publication Data

US 2026/0005698 A1 Jan. 1, 2026

(30) Foreign Application Priority Data

Jul. 1, 2024 (CN) ......................... 202410867618.1

(51) Int. Cl.
*H03M 1/06* (2006.01)
*H03M 1/10* (2006.01)
*H03M 1/12* (2006.01)
*H03M 1/46* (2006.01)

(52) U.S. Cl.
CPC ....... *H03M 1/0604* (2013.01); *H03M 1/1009* (2013.01); *H03M 1/125* (2013.01); *H03M 1/46* (2013.01)

(58) Field of Classification Search
CPC .. H03M 1/0604; H03M 1/125; H03M 1/1009; H03M 1/46
USPC .......................................... 341/118, 120, 163
See application file for complete search history.

(56) References Cited

U.S. PATENT DOCUMENTS 4,195,240 A 3/1980 Otofuji
11,133,812 B1 * 9/2021 Lebedev ................. H03M 1/40
12,088,317 B2 * 9/2024 Park .................... H03M 1/1265

FOREIGN PATENT DOCUMENTS

CN 101364802 A 2/2009

* cited by examiner

*Primary Examiner* — Khai M Nguyen
(74) *Attorney, Agent, or Firm* — Central California IP Group, P.C.; Andrew D. Fortney

(57) ABSTRACT

An error correction method for a successive approximation register analog-to-digital converter and a successive approximation register analog-to-digital converter (SAR ADC) are disclosed, which relate to integrated circuit technology. The successive approximation register analog-to-digital converter error correction method includes the following steps: a. detecting whether a comparator completes a data comparison within a specified time; if so, performing step b; if not, performing step c; b. after the comparator outputs data, starting a next data comparison cycle, and returning to step a; and c. interrupting the conversion, waiting for a signal to start a next conversion, starting the next data comparison cycle, and returning to step a. The method and SAR ADC can effectively prevent problems relating to (1) slow comparator speed caused by dead voltage and (2) burr interference.

17 Claims, 7 Drawing Sheets

SUCCESSIVE APPROXIMATION REGISTER ANALOG-TO-DIGITAL CONVERTER AND ERROR CORRECTION METHOD THEREFOR

CROSS-REFERENCE TO RELATED APPLICATIONS

This application claims the benefit of Chinese Pat. Appl. No. 202410867618.1, filed on Jul. 1, 2024, incorporated herein by reference as if fully set forth herein.

TECHNICAL FIELD

This application relates to the technical field of integrated circuits, in particular to a successive approximation register analog-to-digital converter (SAR ADC). More particularly, it relates to a successive approximation register analog-to-digital converter and an error correction method therefor.

BACKGROUND

Successive approximation register analog-to-digital converters (SAR ADCs) include synchronous SAR ADCs and asynchronous SAR ADCs.

In a synchronous SAR ADC, the clock signal is accessed externally, and the comparison period of each bit of data is equal. In order to ensure the resolution accuracy of the comparator, each comparison period needs to be sufficiently long. This approach is generally used for low-speed analog-to-digital converters.

An asynchronous SAR ADC automatically generates a timing signal by automatically judging the status of the comparator, and the comparison period of each bit of data can be unequal. In addition to avoiding the external input high-speed clock signal, it can also improve the speed. Asynchronous SAR ADCs are usually used in high-speed analog-to-digital converters.

SAR ADCs inevitably have the problem of error. The main causes are a dead voltage in the comparator and burr interference when a dynamic latch is flipped in asynchronous logic.

To facilitate the description of a 10-bit SAR ADC as an example, the following describes a conventional asynchronous SAR ADC operation.

FIG. 1 is a block diagram of the asynchronous architecture in a conventional asynchronous SAR ADC. When the external timing signal CLK_ST is "0," the asynchronous logic does not operate, the comparator Comp outputs OUTN and OUTP as "0," the dynamic latch(es) are in a reset state, the decision module Comp Finish outputs "0," and the clock signal generator CLK_GEN does not flip. The value of the SAR Logic output Out_data is 0.

When the external CLK_ST signal is "1," the clock signal generator produces a first pulse CLK, and the comparator makes the first comparison after receiving the first pulse. After comparing the inputs, it outputs "01" or "10." The output data is sent to the dynamic latch(es) for latching, and the SAR Logic module reads the latch(es) for processing its output and counts a "1." The output data is also given to the decision module. After the decision module detects that the output of the comparator is no longer the initial full "0," the decision comparison is completed and the clock signal generator is controlled to generate the next pulse. After receiving the next (second) pulse, the comparator resets the output to full "0" and begins a second comparison. After the result of the second comparison, the comparator outputs "01" or "10." The output data is stored in the dynamic latch(es), and the SAR Logic module reads the latch to process the output and increment the count to 2. The output data is also given to the decision module. After the decision module detects that the output of the comparator is no longer the initial full "0," the decision comparison is completed and the clock signal generator is controlled to generate the next pulse. This cycle continues until a tenth cycle, in which the comparator resets the output to all "0" after receiving the tenth pulse. The comparator makes the tenth comparison, and outputs "01" or "10" after the comparison. The output data is stored in the dynamic latch(es). The SAR Logic module reads the latch(es) to process the output, and the count is "10." The output count signal terminates and the CLK_GEN module generates a clock pulse. This ends the loop and outputs the data.

An error may be caused by dead-time voltage.

As mentioned before, in the logic of the asynchronous SAR ADC, whether the current cycle can enter the next cycle (generating the next clock pulse) depends on when the comparator completes the comparison and outputs "01" or "10." However, the speed of the comparator is limited, and there is always a dead voltage. When the difference between the inputs DACN and DACP is very small, or the inputs are the same, the comparator may not be able to complete the comparison of the output "01" or "10" in the specified time. This makes subsequent conversion cycles impossible, so that the correct number cannot be output, resulting in an error, as shown in FIG. 2.

Another source of SAR ADC error is burr interference when the dynamic latches are flipped.

As shown in FIG. 3, when the comparator has not completed the comparison and the output is close at this time, if there is burr interference, the outputs (e.g., OUTP and OUTN) will both be "1" at the same time for a short time. In this case, the dynamic latch(es) will lock the result, and cannot be recovered. The reason is that the dynamic latch uses semi-dynamic logic in order to pursue speed, and once the result is locked, it cannot be recovered.

Alternatively, when the comparator does not complete the comparison and the output is close, if there is burr interference that makes the output result near the threshold voltage for a short time, the decision circuit may have flipped, the output result may not have actually increased, and the dynamic latch(es) may read the wrong result (e.g., "0"), as shown in FIG. 4.

Obviously, these two conditions come from the interference in the circuit, independent of the comparator's dead voltage. No matter how fast the comparator speed, or how small the dead voltage, this situation can still happen.

SUMMARY

One main purpose of this application is to provide a method of error correction for a successive approximation register ADC and a successive approximation register ADC, which can correct errors caused by a comparator's dead voltage and/or burr interference when one or more dynamic latches are reversed in asynchronous logic without affecting the speed of the main circuit (e.g., the successive approximation register ADC).

In order to achieve the above purpose, according to one aspect of specific embodiments of this application, a method of correcting an error in a successive approximation register analog-to-digital converter (SAR ADC) is provided, including the following steps:

a. Determining whether a comparator (e.g., in the SAR ADC) completes a data comparison within a specified time. If yes, go to Step b. If no, go to Step c.

b. After the comparator outputs data (e.g., a result of the comparison), beginning a next data comparison, and returning to Step a; or c. Interrupting a conversion cycle (e.g., the next comparison), waiting for a signal to start a next conversion, (then) starting the next data comparison, and returning to step a.

Alternatively, the method may comprise determining whether a comparator in the SAR ADC completes a data comparison within a specified time; when the comparator completes the data comparison within the specified time, outputting data from the comparator, beginning a next data comparison, and determining whether the comparator completes the next data comparison within the specified time; and when the comparator does not complete the data comparison within the specified time, interrupting a conversion cycle (e.g., of the SAR ADC, by not outputting the data and/or not immediately performing the next comparison), waiting for a signal to start a next conversion, then starting the next data comparison, and determining whether the comparator completes the next data comparison within the specified time.

In one embodiment, step c (e.g., interrupting the conversion cycle) comprises turning off a clock or timing signal generator (e.g., in the SAR ADC), outputting a forced interrupt signal (e.g., from a time decision module in the SAR ADC), and/or transmitting an error signal (e.g., from a SAR logic module in the SAR ADC).

In another embodiment, the error signal is consistent with the output information of an input signal to the comparator (e.g., at the same time). Alternatively, the error signal can have a same format as output data from the SAR ADC (e.g., when the output data from the SAR ADC is x bits wide, the error signal is x bits wide).

In some embodiments, the method further includes:

d. Reading and/or storing final output data from positive and negative terminals of the comparator (e.g., when the comparator is a differential comparator) in a latch (e.g., a differential latch);

e. Before outputting the final output data, determining whether the positive and negative terminals (e.g., a bit of a differential signal, such as a differential output from the comparator, or of data stored in the differential latch, which may be determined by performing a comparison) are both 1 or both 0. If yes, go to Step f. If no, go to Step g;

f. Correcting an output (e.g., of the latch or the SAR logic module) and/or a current bit (e.g., stored in the latch) as an error, outputting a forced interrupt signal and transmitting an error signal (e.g., from the SAR logic module, to interrupt a conversion [e.g. of an analog input signal received at the comparator to a corresponding digital output signal]), waiting for a start signal for a next conversion, starting the data comparison of the next conversion, and returning to step d to read and/or store a next bit of data; and g. Outputting the final output data and returning to Step d to read and/or store the next bit of data.

Alternatively, the comparator may comprise a differential comparator, the one or more latches may comprise a differential latch, and the method may further comprise storing differential output data from the differential comparator in the differential latch; determining whether positive and negative terminals or poles of the differential output data (e.g., by performing a comparison) are both 1 or both 0; when the positive and negative terminals or poles of the differential output data are both 1 or both 0, indicating that the differential output data is a bit error, outputting a forced interrupt signal (e.g., from a time decision module in the SAR ADC), transmitting an error signal (e.g., from the SAR logic module), waiting for a start signal (e.g., corresponding to the beginning of the next comparison or the next analog-to-digital conversion cycle), starting the next data comparison, and storing a next bit of differential output data from the differential comparator in the differential latch; and when the positive and negative terminals or poles of the differential output data are neither both 1 nor both 0, outputting the differential output data and storing a further next bit of differential output data from the differential comparator in the differential latch.

In order to achieve the above purpose(s), according to another aspect of specific embodiments of this application, a successive approximation register analog-to-digital converter (SAR ADC) is disclosed, which comprises a comparator, a clock or timing signal generator, a SAR logic module, and a time decision module connected to an output terminal of the comparator. The time decision module has one or more output terminals connected to the clock signal generator and the SAR logic module, and the time decision module also has a timing terminal (e.g., a trigger signal input) connected to a trigger signal of the clock or timing signal generator.

In some embodiments, the time decision module is configured to detect whether the comparator completes a data comparison within a specified time. If yes (e.g., when the time decision module determines that the comparator completed the data comparison within the specified time), the comparator outputs the data (e.g., the output of the comparator is stored in a memory such as a latch), and a next data comparison is started (e.g., by the SAR ADC). If no (e.g., when the time decision module determines that the comparator did not complete the data comparison within the specified time), the time decision module outputs a forced interrupt signal, the SAR Logic module transmits an error signal to interrupt the conversion cycle (e.g., to prevent storage of the comparator output in the memory and/or outputting the data from the SAR ADC), and the comparator waits for the signal (e.g., a start signal) to start the next conversion or conversion cycle and/or to start the next data comparison.

In another embodiment, when the error signal is same with the input signal of the comparator, the output information is consistent. Alternatively, the error signal has a format that is consistent with or same as output data from the SAR ADC.

In another embodiment, the SAR ADC also includes a memory and a data comparator. The memory is connected to the SAR logic module, and the data comparator is connected to the memory.

In another and/or further embodiment, the memory is configured to store the data output from comparator (e.g., positive and negative terminals of the comparator and/or an output of the SAR logic module), and the data comparator is configured to compare whether the data output by the comparator (e.g., on the positive and negative terminals) is both "1" or both "0."

When the positive and negative terminals (e.g., a differential bit of data thereon) are both "1" or both "0," it is determined (e.g., the data comparator determines) that there is an error. The output (e.g., of the SAR ADC) starting from the current bit (e.g., the comparator output in a current conversion or comparison cycle) is modified into (e.g., output as) an error signal, the data comparator (or the time decision module) outputs a forced interrupt signal, the SAR logic module may also send out an error signal (e.g., the same as or different from the error signal modified from the output), and the comparator may read the next bit of data (e.g., compares the analog differential input signal in the next conversion or comparison cycle) after the output is modified into an error signal and the forced interrupt signal is output.

In other embodiment, the memory comprises a data (or D-type) flip-flop (DFF).

According to the disclosed technical scheme and its further improved technical scheme(s) in certain exemplary embodiments, the present application has the following beneficial effects:

It can effectively prevent the comparator speed from slowing down due to dead voltage. In addition, the time decision module in parallel with the main circuit (e.g., the comparator-to-latch path) does not consume any time in the conversion (or sampling) cycle (e.g., of the SAR ADC), so it does not reduce the overall conversion rate (e.g., of analog signal[s]/data to digital signal[s]/data).

Further, this application can effectively prevent errors caused by burr interference, and in the process of preventing a burr interference error, the result (e.g., data) in the latch is used to judge the processing error, which is a digital process. The whole process is not in the conversion cycle, and does not consume any conversion cycle time. This does not reduce the speed of the converter, making it ideal for high-speed asynchronous SAR ADCs.

The following is a further explanation of this application in combination with the attached drawings and specific implementation methods. The additional aspects and advantages of this application will be partially given in the description below, and partially will become apparent from the description below, or will become known through the practice of this application.

BRIEF DESCRIPTION OF THE DRAWINGS

The drawings that form part of this application are used to provide further understanding of this application, and the specific embodiments, schematic embodiments and descriptions of this application are used to interpret this application and do not constitute limitations of this application. In the drawings:

FIGS. 7A and 7B are waveform diagrams showing the relationship between the signal and the time in the time detection circuit of embodiment 1, wherein FIG. 7A is a normal state diagram of the relationship between the signal and the time, and FIG. 7B is an abnormal state diagram of the relationship between the signal and the time;

EXAMPLES

It should be noted that specific embodiments, exemplary embodiments, and features therein in this application may be combined without conflict. This application is described in detail with reference to the attached drawings and in conjunction with the following.

In order to enable those skilled in the art to better understand the application scheme, the following will be combined with specific embodiments of the application and the attached drawings to give a clear and complete description of specific embodiments of the application and the technical scheme(s) in the exemplary embodiments. It is readily apparent that the application is not limited to the exemplary embodiments described herein, but extends beyond the described embodiments. Based on the specific embodiments and exemplary embodiments in this application, all other embodiments and embodiments obtained by ordinary skilled personnel in the field without making creative labor shall fall within the scope of protection in this application.

Embodiment 1

Figure 1:
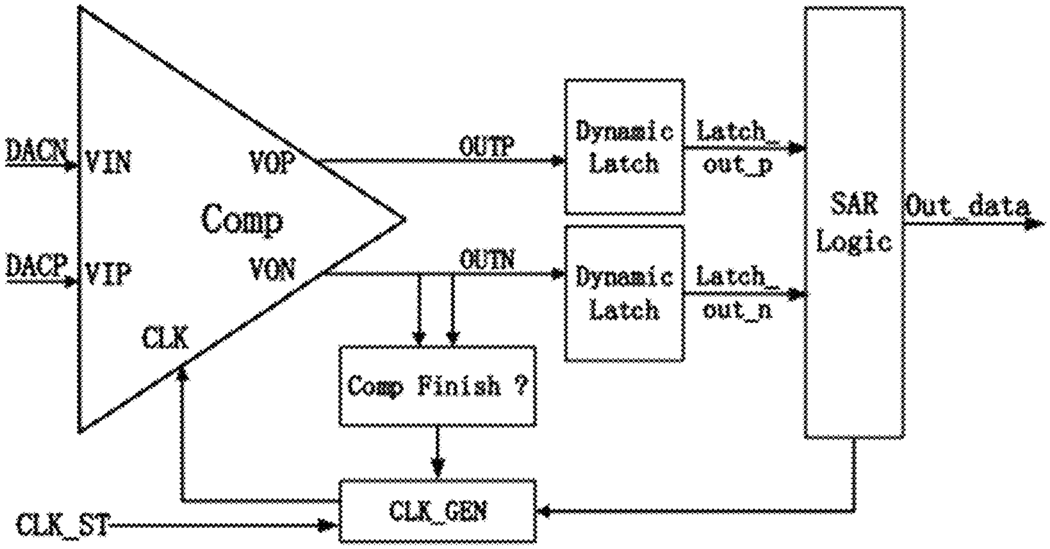
FIG. 1 is a schematic diagram of a conventional asynchronous SAR ADC.

For the asynchronous SAR ADC shown in FIG. 1, whether its operating logic can be carried from the current operating cycle to the next cycle (e.g., generate the next clock pulse) depends on when the comparator Comp finishes comparing (e.g., the differential input signal) sufficiently to provide an output “01” or “10.” However, the speed of the comparator Comp is limited, and there is inevitably a dead voltage (e.g., when the input signal changes state or value). When the difference between the input terminals is very small or substantially zero, the comparator Comp may not be able to complete the comparison and provide the output “01” or “10” in the specified time. When this occurs, the SAR Logic module sends out an error signal “1000000000” (for a 10-bit ADC, for example), which prevents the subsequent conversion (e.g., sampling) cycle, and the asynchronous SAR ADC generates an error.

In this case, the time decision module Time_MAX determines the output of the comparator. It not only determines whether the output of the comparator Comp is “10” or “01,” but also detect the comparison time of the comparator, but also uses the signal CLK_ST as the start signal to time the comparison time. If the comparison time of the comparator exceeds a certain threshold (e.g., the time between successive rising or falling edges of the signal CLK_ST), the conversion cycle is interrupted and the clock signal generator CLK_GEN is shut down. The force interrupt signal Force_out is output (e.g., activated), which makes the SAR Logic module output the error signal “1000000000” to wait for a signal to start the next conversion.

Figure 6:
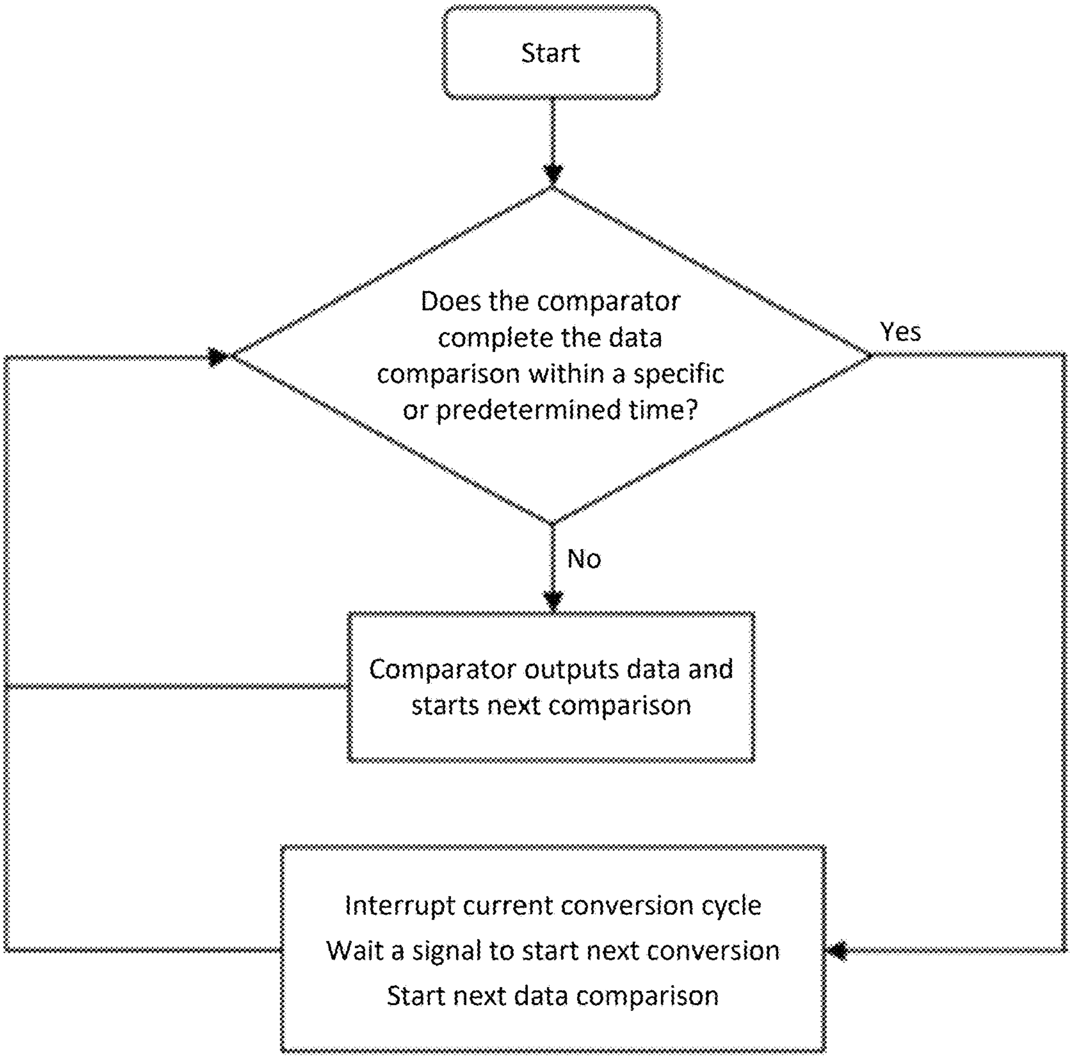
FIG. 6 shows a flow chart of an exemplary method of correcting an error in the analog-to-digital converter in embodiment 1.

The method or process of error correction is shown in FIG. 6. This time detection method can effectively prevent the comparator speed from slowing down due to dead voltage. In addition, a time decision module may be parallel with a main circuit (e.g., a comparator-to-latch path), which does not consume time during the main cycle (e.g., the ADC conversion or sampling cycle), so it does not reduce the overall conversion rate.

Figure 5:
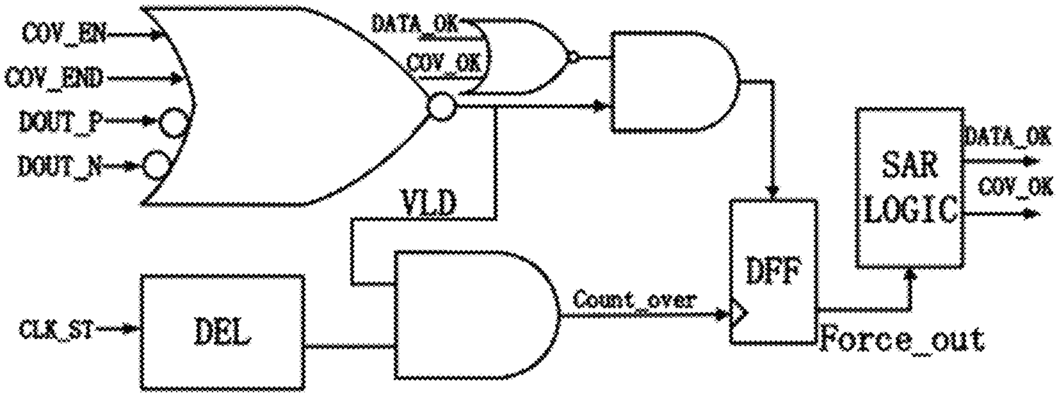
FIG. 5 is a schematic diagram of an exemplary time detection circuit according to embodiment 1.

In this example or embodiment, an exemplary time decision module is shown in FIG. 5. The logic circuit consists of one or more logic gates (e.g., one or more NOR gates and/or one or more AND gates), a delay unit DEL, a selector DFF (e.g., a D-type flip-flop), and an SAP logic module SAR_LOGIC. DACP, DACN, OUTP and OUTN are respectively the input(s) and output(s) of the comparator (see, e.g., FIG. 10), COV_EN is the conversion end signal, COV_END is a forced end signal, VLD is a conversion duration signal (indicating the time taken for the comparison within each conversion cycle), DATA_OK is the data completion signal, COV_OK is the conversion completion signal, CLK_ST is the conversion start signal, Count_over is the detection result (e.g., the result of a determination as to whether the comparison was completed within the specified time), and Force_out is a forced interrupt signal. A signal (e.g., a differential analog input signal) is received by the comparator to obtain comparison result signal OUTP, OUTN, which may be passed to the NOR gate (e.g., on the far left-hand side of FIG. 5, as input[s] DOUT_P, DOUT_N) to get the conversion duration signal VLD. If the comparison is completed normally (e.g., within the specified time), then COV_EN ends the comparison or conversion cycle. When the comparator is too slow and the result is not returned for a long time (e.g., within the specified time), the VLD signal will not return the result for a long time, and then another logic gate (e.g., the AND gate in the lower left of FIG. 5) adds the VLD signal and a delayed CLK_ST signal to obtain the result Count_over (whose normal case is 0; an error will generate a pulse signal). The selector DFF sends the result to the SAR_LOGIC module, generating a DATA_OK signal and a COV_OK signal, ending the conversion, and feeding back the DATA_OK and COV_OK signals to the time decision module (e.g., to the right-hand NOR gate in FIG. 5) to reset the detection result and not affect the next conversion.

Figure 7A:
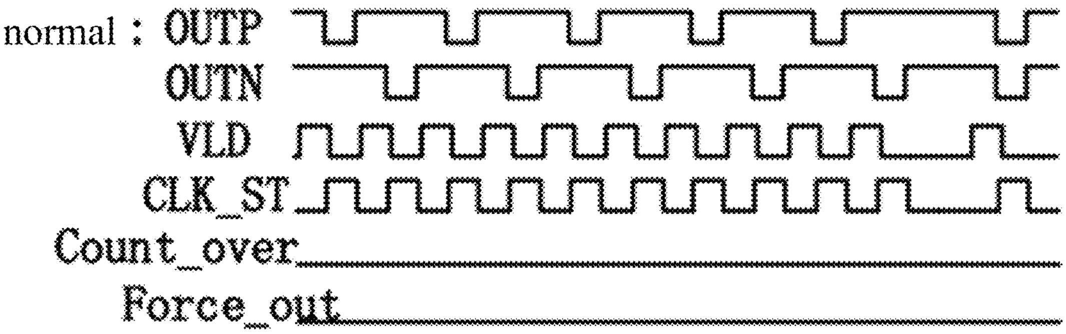
Figure 7B:
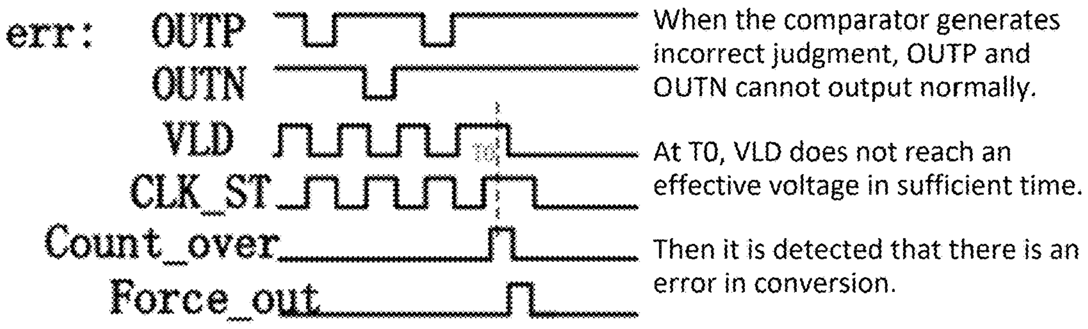

FIGS. 7A and 7B show waveform diagrams of the relationship between the time and certain signals of the time decision module. As shown in FIG. 7A, under normal conversion conditions, the overlap time of VLD and CLK_ST is too short to generate a pulse signal, so Count_over and Force_out are always 0, without interrupting the conversion (or successive conversion cycle [s]).

In the case of an error, as shown in FIG. 7B, OUTP and OUTN do not produce a "01" or "10" result within the specified time, and VLD does not have a falling edge for a long time (e.g., within the specified time), which will generate a pulse signal Count_over when it is associated (or logically combined) with CLK_ST, thus interrupting the conversion.

Embodiment 2

Another source of error for asynchronous SAR ADCs is burr interference when dynamic latches are flipped. The conventional solution uses an XOR gate to decide whether the comparator has completed the comparison, which has two problems: 1. As a digital circuit, the XOR gate still has the intermediate state problem in its operation; that is, when both inputs are near the threshold, the output of the XOR gate cannot be guaranteed to be correct. Any more general logic gate will have its own threshold voltage, and when the input is near this voltage, a misjudgment may occur. 2. An XOR gate, relative to a simple NOR gate, can greatly increase the circuit delay, which is very unfavorable for high-speed asynchronous SAR ADCs.

Figure 2:
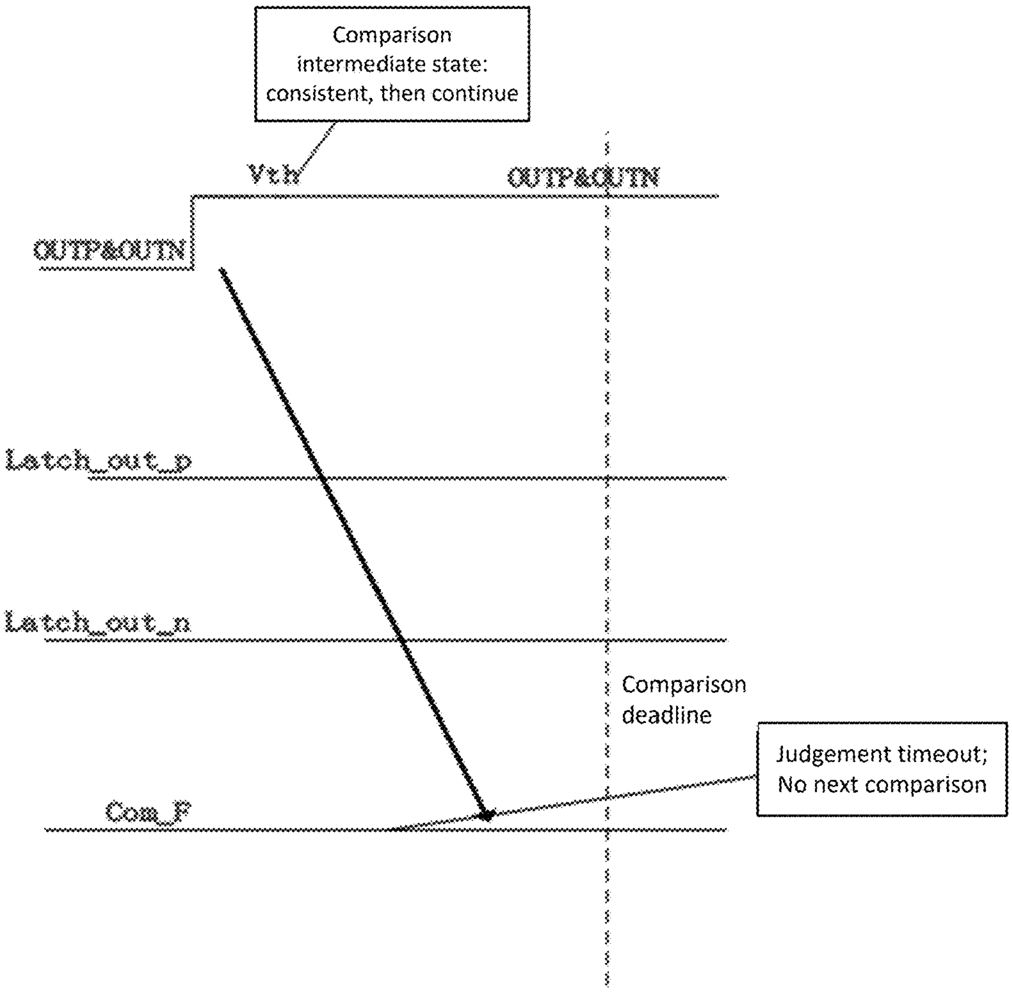
FIG. 2 shows a diagram of various signal levels that cannot be compared during a dead voltage condition.
Figure 3:
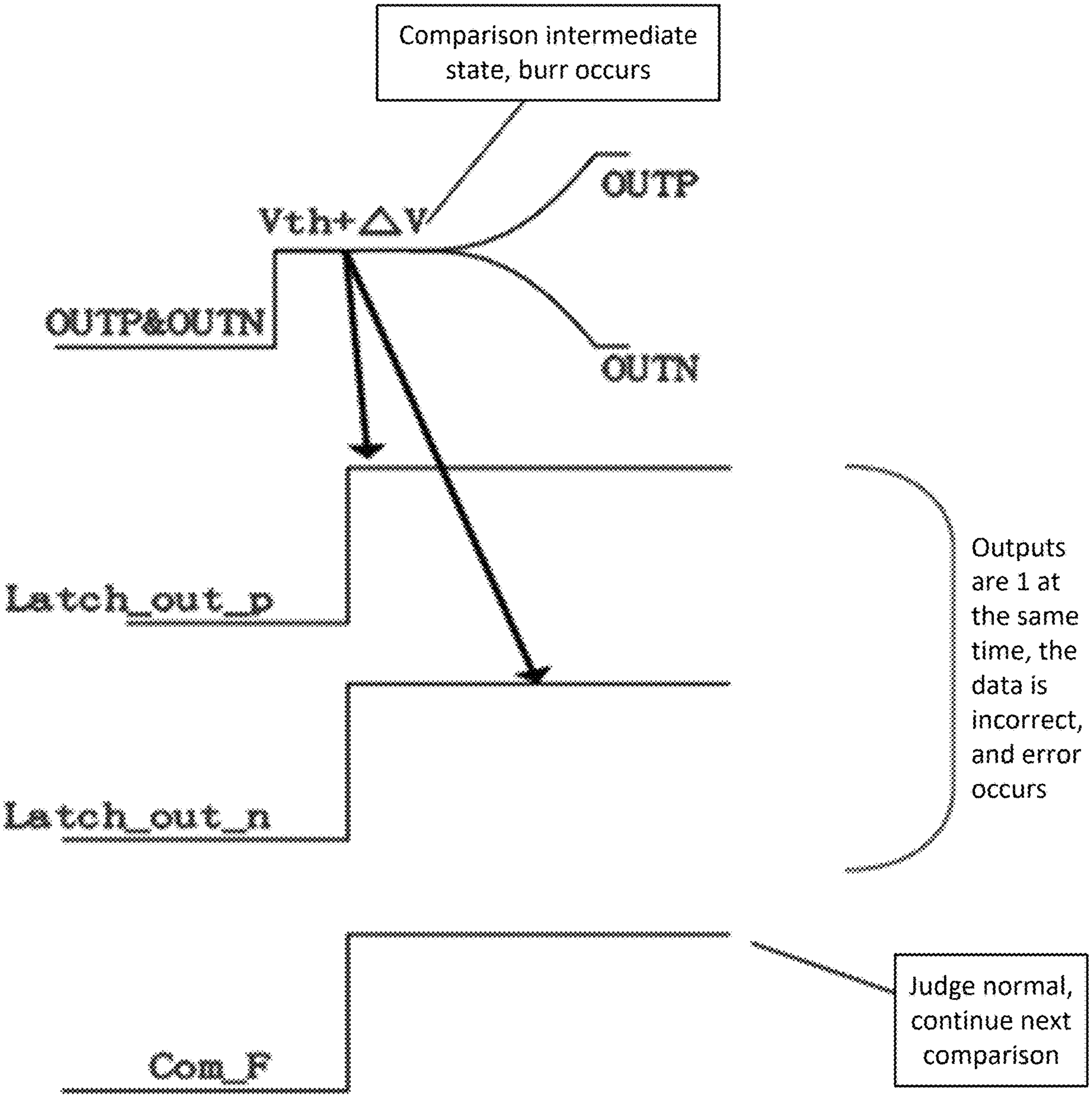
FIG. 3 shows a diagram of various signal levels when burr interference causes an output “1” error.
Figure 4:
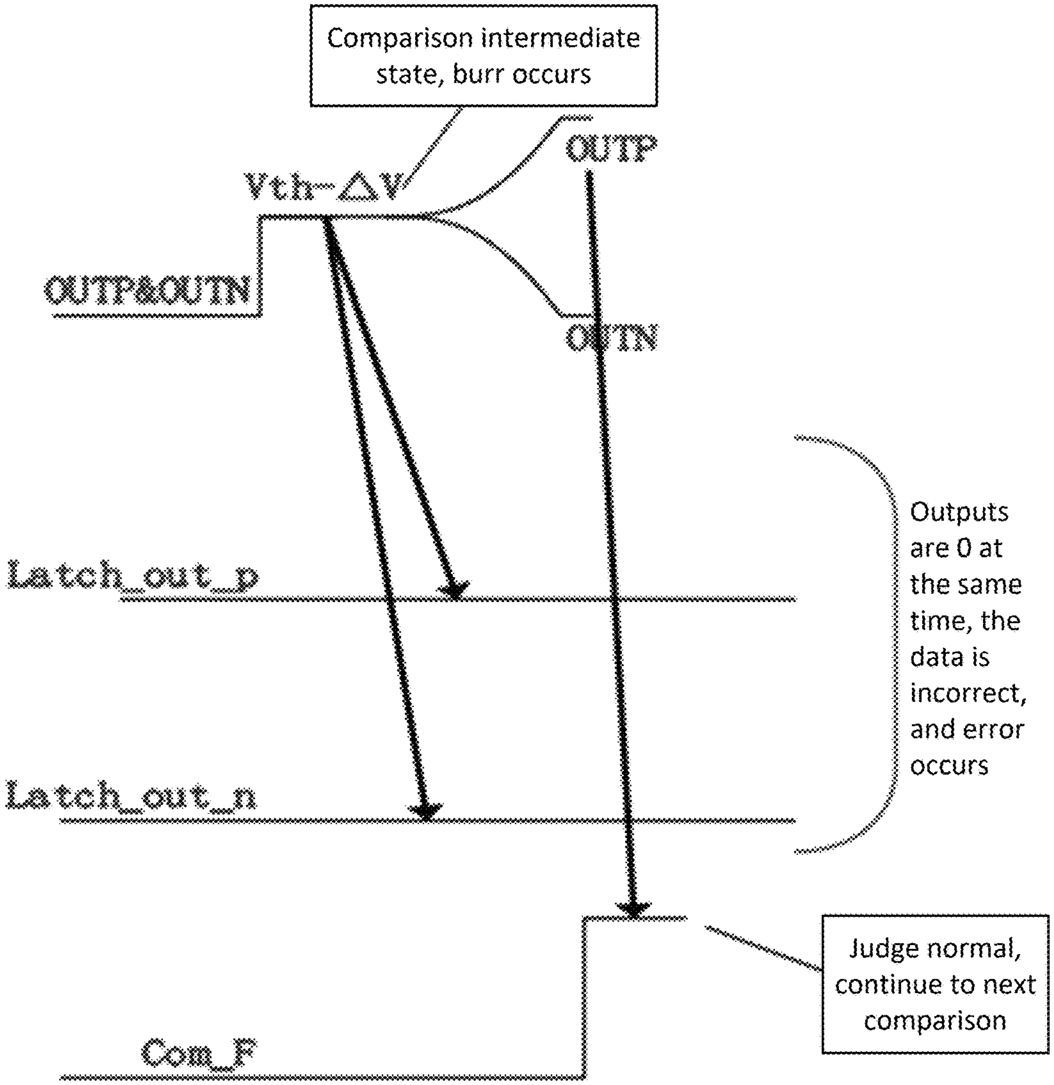
FIG. 4 shows a diagram of various signal levels when burr interference causes an output “0” error.
Figure 8:
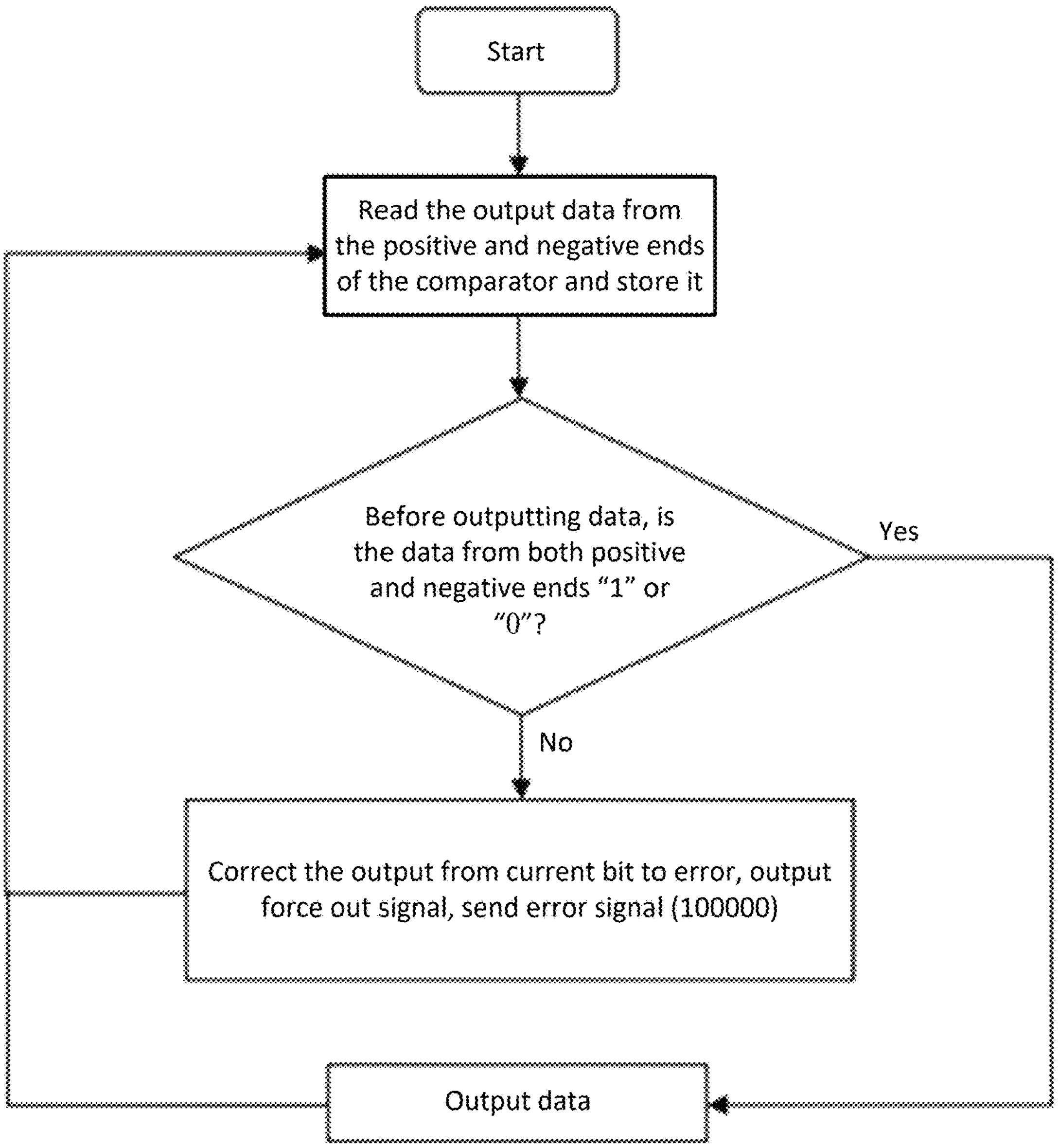
FIG. 8 shows a flow chart of an exemplary method of correcting an error in the analog-to-digital converter according to embodiment 2.

In this example or embodiment, the method of correcting an error in an analog-to-digital converter adopts an a posteriori technique, and directly stores the output OUTP and OUTN from positive and negative terminals of the comparator (using a DFF as memory for storage). Before the output is compared (or, alternatively, before the comparison is completed), once it is found that a bit (or differential signal) on the positive and negative terminals of the comparator has a value of "1" or "0," it is determined whether there is an error. If so, the output for the current bit (e.g., from the SAR ADC) is immediately fixed or changed to 1000000000 (for a 10-bit ADC, for example). The flow of this embodiment of the correction method is shown in FIG. 8. Since the final output in the latch is read, rather than the direct output of the comparator, there is no intermediate state problem approaching the threshold (see, e.g., FIGS. 2-4 and the discussion [s] thereof). Thus, the intermediate state problem(s) in error decision(s) are avoided. Another advantage of this example or embodiment is to use the results in the latch to process the error (e.g., using digital processing). In this manner, the whole process (e.g., error notification process) is not in the ADC conversion cycle, does not consume any conversion cycle time, and does not reduce the speed of the converter, so is very suitable for high-speed asynchronous SAR ADCs.

Figure 9:
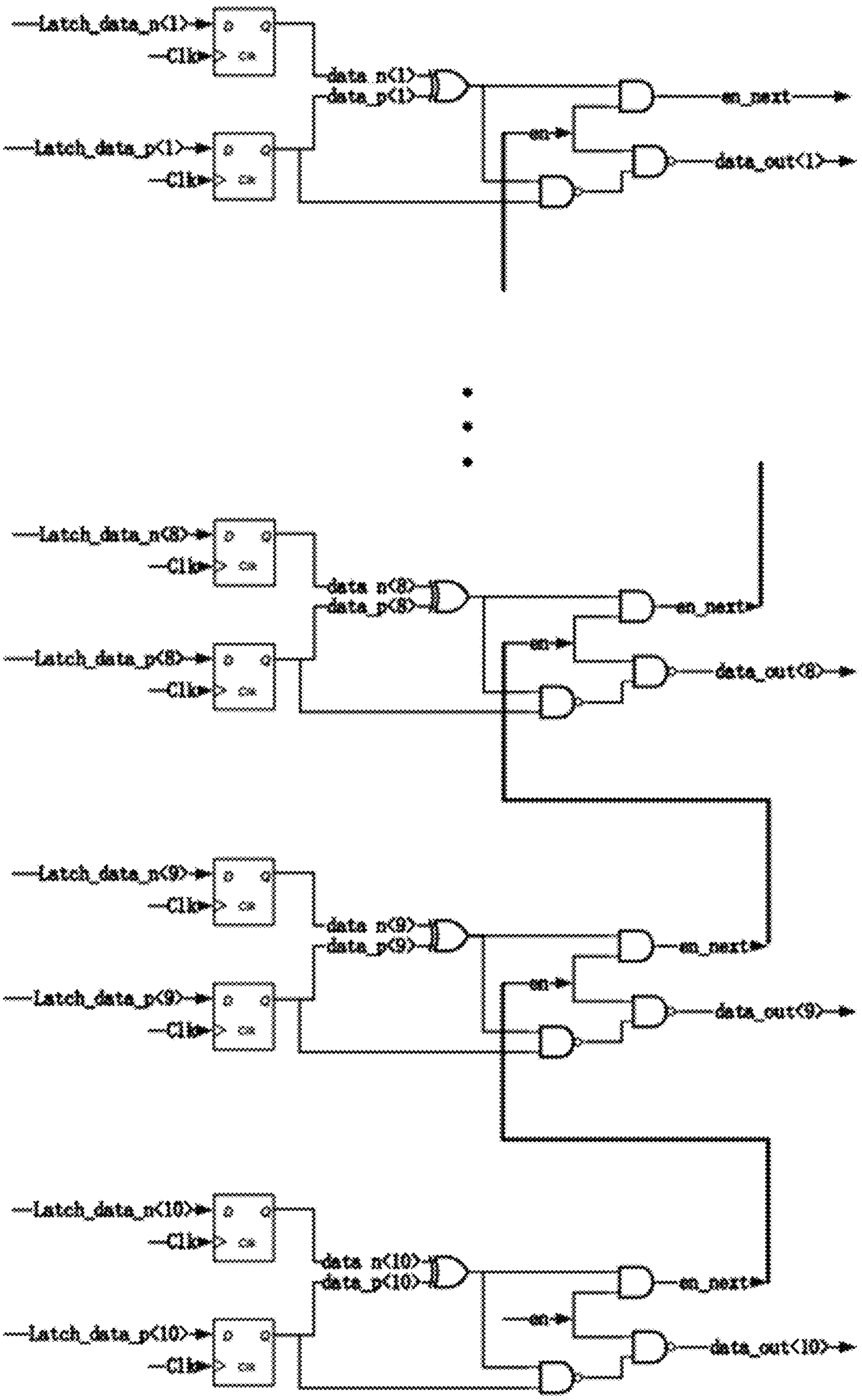
FIG. 9 is a schematic diagram of an exemplary logic circuit suitable for the error correction method of embodiment 2.

FIG. 9 shows an exemplary logic circuit for the error correction method in this example or embodiment. The signal processing flow of the logic circuit is as follows:

a. reading the comparator decision result Latch_data<n> in a latch (e.g., the latch), wherein the result data<n> generates a reference data of the comparison through an or gate (e.g., using an XOR gate), so as to get a start time and a finish time of each comparison;
b. Enabling en (e.g., an enable signal), and outputting an n-th judgment result data_out<n>;
c. according to a comparator completion time obtained in processing flow step a (e.g., from the start time and/or the finish time of the comparison), shortening an enabling range of en to get en_next; and
d. Passing en_next to an (n−1)-th logic circuit (e.g., as signal en, as shown in FIG. 9, to enable it [e.g., the (n−1)-th logic circuit] and ensure that the last comparison result is read before proceeding, to prevent data conflicts).

Embodiment 3

Figure 10:
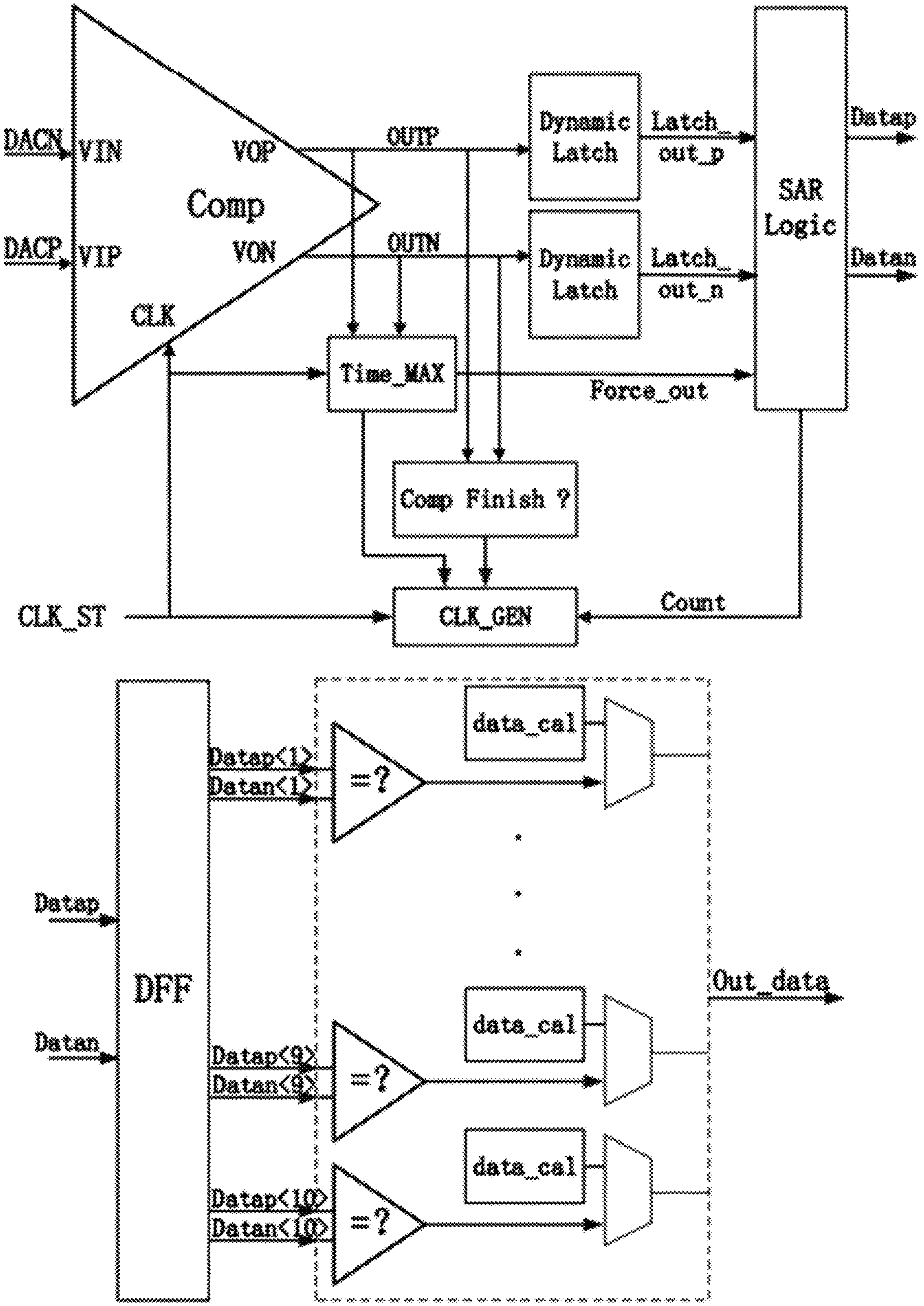
FIG. 10 is a schematic diagram of an exemplary asynchronous SAR ADC structure according to embodiment 3.

The work flow of the error correction circuit shown in FIG. 10 is as follows:

a. The comparator Comp compares the input DACN and DACP to get the result OUTP and OUTN, and provides the result to the time decision module Time_MAX and the dynamic latch(es) for storage;
b. The time decision module Time_MAX determines whether the comparison has been completed within the specified time. If yes, perform work flow step c; otherwise, perform work flow step d;
c. When it is determined that the comparison time is too long (e.g., not within the specified time), a forced interrupt signal Force_out is generated and sent to the SAR logic module SAR Logic, and the same or a different signal is sent from the time decision module Time_MAX to the CLK_GEN module. Then the SAR logic module stops the subsequent conversion process. Thereafter, perform work flow step e;

d. The SAR logic module determines that the comparison for the current cycle is complete, outputs the comparison data, and sends a comparison completion signal (e.g., Count) to the CLK_GEN module until the conversion(s) are completed (e.g., for all bits in the SAR ADC). All of the final data (e.g., all bits in the SAR ADC) are output (e.g., from the SAR logic module). Thereafter, perform work flow step e;

e. Control the start and interrupt of the comparator according to the results of the SAR logic module and the time decision module. After the conversion is complete or interrupted, proceed to work flow step f;

f. Send the SAR logic module's final data Datap and Datan to the DFF;

g. Determine whether Datap<n> and Datan<n> (e.g., each digital bit of data output from the DFF) are the same. If yes, an error occurs. Select the data_cal module to generate an error signal (e.g., 1000000000 bits in the 10-bit ADC example). Otherwise, the data bits output from the DFF are normal, and output data Out_data are output directly.

As shown in FIG. 10, the SAR ADC in this example includes a comparator, a clock signal generator, a SAR logic module, a time decision module, a memory and a data comparator (as shown in the dashed box in FIG. 10).

The input terminal(s) of the time decision module are connected to the output terminal(s) of the comparator, output terminal(s) of the time decision module may be respectively connected to the clock signal generator and the SAR logic module, and a timing input (e.g., the timing terminal) of the time decision module may be connected to an output (e.g., the trigger signal CLK_ST) of the clock or timing signal generator CLK_GEN.

The memory (e.g., DFF) may be connected to the SAR logic module (e.g., an output thereof), and the data comparator may be connected to the memory (e.g., outputs thereof).

The memory may store the data output on the positive and negative terminals of the comparator via the SAR logic module. The data comparator may compare whether positive and negative terminals or poles of a certain bit of data output from the comparator are both "1" or both "0."

When the positive and negative terminals or poles of a data bit are both "1" or both "0," it is determined that there is an error. The output from the current bit is corrected or changed to an error signal, the data comparator (or the time decision module) outputs a forced interrupt signal (e.g., Force_out or, in the case of the data comparator, similar to Force_out from the time decision module), and the SAR logic module sends an error signal (e.g., 1000000000 in the 10-bit SAR ADC example), and the data comparator reads and/or compares the next bit of data.

In this example, the storage (e.g., memory) uses or includes DFF storage, which is a D-type (e.g., edge-triggered) memory element that can store the data output from the positive and negative terminals of the comparator, as output from the SAR logic module.

What is claimed is:

1. A method of correcting an error in a successive approximation register analog-to-digital converter (SAR ADC), comprising:

a) determining whether a comparator completes a data comparison within a specified time;

b) when the comparator completes the data comparison within the specified time, outputting data from the comparator, beginning a next data comparison, and determining whether the comparator completes the next data comparison within the specified time; and c) interrupting a conversion cycle, waiting for a signal to start a next conversion, then starting the next data comparison, and determining whether the comparator completes the next data comparison within the specified time.

2. The method in claim 1, wherein interrupting the conversion cycle comprises turning off a clock or timing signal generator, outputting a forced interrupt signal, and/or transmitting an error signal.

3. The method in claim 2, wherein the error signal is consistent with output information of an input signal to the comparator.

4. The method in claim 2, wherein the error signal has a same format as output data from the SAR ADC.

5. The method in claim 1, further comprising:

a) reading and/or storing final output data from positive and negative terminals of the comparator in a latch;

b) before outputting the final output data, determining whether the positive and negative terminals are both 1 or both 0;

c) when the positive and negative terminals are both 1 or both 0, correcting an output and/or a current bit as an error, outputting a forced interrupt signal and transmitting an error signal, waiting for a start signal for a next conversion, starting the data comparison of the next conversion, and returning to step d to read and/or store a next bit of data; and d) when the positive and negative terminals are neither both 1 nor both 0, outputting the final output data and returning to step d to read and/or store the next bit of data.

6. A successive approximation register analog-to-digital converter (SAR ADC), comprising a comparator, a clock or timing signal generator, a SAR logic module, and a time decision module, wherein the time decision module has an input terminal connected to an output terminal of the comparator, the time decision module has one or more output terminals connected to the clock or timing signal generator and SAR logic module, the time decision module has a timing terminal connected to a trigger signal of the clock or timing signal generator, and the time decision module is configured to detect whether the comparator completes the data comparison within a specified time;

when the time decision module determines that the comparator completed the data comparison within the specified time, the comparator outputs data and starts a next data comparison, and when the time decision module determines that the comparator did not complete the data comparison within the specified time, the time decision module outputs a forced interrupt signal, the SAR logic module transmits an error signal, and the comparator waits for a signal to start a next conversion and/or start a next data comparison.

7. The successive approximation register analog-to-digital converter in claim 6, wherein when the error signal is same with the input signal of the comparator, the output information is consistent.

8. The successive approximation register analog-to-digital converter in claim 6, wherein the error signal has a format that is consistent with or same as output data from the SAR ADC.

9. The successive approximation register analog-to-digital converter in claim 6, further comprising a memory and a data comparator, wherein the memory is connected to the SAR logic module, and the data comparator is connected to the memory.

10. The successive approximation register analog-to-digital converter in claim 9, wherein the memory is configured to store data output on positive and negative terminals of the comparator and/or an output of the SAR logic module, and the data comparator is configured to compare whether the data output on the positive and negative terminals of the comparator are both "1" or both "0".

11. The successive approximation register analog-to-digital converter in claim 10, wherein when the positive and negative terminals are both "1" or both "0," the data comparator determines that there is an error, an output of the SAR ADC is modified into an error signal, the data comparator or the time decision module outputs a forced interrupt signal.

12. The successive approximation register analog-to-digital converter in claim 10, wherein after the output is modified into an error signal and the forced interrupt signal is output, the data comparator reads and/or compares a next bit of data.

13. The successive approximation register analog-to-digital converter in claim 9, wherein the memory comprises a data or D-type flip-flop (DFF).

14. A successive approximation register analog-to-digital converter (SAR ADC), comprising:

a comparator;

a clock or timing signal generator;

a SAR logic module;

a time decision module;

a memory; and a data comparator, wherein:

the time decision module has an input terminal connected to an output terminal of the comparator, the time decision module has one or more output terminals connected to the clock or timing signal generator and SAR logic module, the time decision module has a timing terminal connected to a trigger signal of the clock or timing signal generator, the memory is connected to the SAR logic module, the data comparator is connected to the memory, the memory is configured to store data output on positive and negative terminals of the comparator and/or an output of the SAR logic module, and the data comparator is configured to compare whether the data output on the positive and negative terminals of the comparator are both "1" or both "0".

15. The successive approximation register analog-to-digital converter in claim 14, wherein when the positive and negative terminals are both "1" or both "0," the data comparator determines that there is an error, an output of the SAR ADC is modified into an error signal, the data comparator or the time decision module outputs a forced interrupt signal.

16. The successive approximation register analog-to-digital converter in claim 14, wherein after the output is modified into an error signal and the forced interrupt signal is output, the data comparator reads and/or compares a next bit of data.

17. The successive approximation register analog-to-digital converter in claim 14, wherein the memory comprises a data or D-type flip-flop (DFF).

* * * * *